(12) United States Patent
Zhang et al.

(10) Patent No.: US 11,315,801 B2
(45) Date of Patent: Apr. 26, 2022

(54) PROCESSING OF WORKPIECES USING OZONE GAS AND HYDROGEN RADICALS

(71) Applicants: Mattson Technology, Inc., Fremont, CA (US); Beijing E-Town Semiconductor Technology Co., Ltd., Beijing (CN)

(72) Inventors: Qi Zhang, San Jose, CA (US); Haichun Yang, San Jose, CA (US); Hua Chung, Saratoga, CA (US); Michael X. Yang, Palo Alto, CA (US)

(73) Assignees: BEIJING E-TOWN SEMICONDUCTOR TECHNOLOGY CO., LTD, Beijing (CN); MATTSON TECHNOLOGY, INC., Fremont, CA (US)

( * ) Notice: Subject to any disclaimer, the term of this patent is extended or adjusted under 35 U.S.C. 154(b) by 0 days.

(21) Appl. No.: 17/326,945

(22) Filed: May 21, 2021

(65) Prior Publication Data
US 2021/0366727 A1 Nov. 25, 2021

Related U.S. Application Data

(60) Provisional application No. 63/028,786, filed on May 22, 2020.

(51) Int. Cl.
*H01L 21/3213* (2006.01)
(52) U.S. Cl.
CPC .. *H01L 21/32136* (2013.01); *H01L 21/32138* (2013.01)

(58) Field of Classification Search
None
See application file for complete search history.

(56) References Cited

U.S. PATENT DOCUMENTS

| | | | |
|---|---|---|---|
| 3,582,604 A | 6/1971 | Bykhovsky et al. | |
| 4,579,623 A | 4/1986 | Suzuki et al. | |
| 6,849,122 B1 | 2/2005 | Fair | |
| 8,153,524 B2 | 4/2012 | Aubel et al. | |
| 8,747,960 B2* | 6/2014 | Dordi | H01L 21/7684 427/535 |
| 9,460,959 B1* | 10/2016 | Xie | B08B 9/027 |

(Continued)

FOREIGN PATENT DOCUMENTS

CN 101030531 A 9/2007

OTHER PUBLICATIONS

Kim, "Surface treatment of metals using an atmospheric pressure plasma jet and their surface characteristics", Surface and Coatings Technology, vol. 174, 2003, pp. 839-844.

(Continued)

*Primary Examiner* — Stephanie P Duclair
(74) *Attorney, Agent, or Firm* — Dority & Manning, P.A.

(57) ABSTRACT

Methods for processing a workpiece are provided. The workpiece can include a ruthenium layer and a copper layer. In one example implementation, a method for processing a workpiece can include supporting a workpiece on a workpiece support. The method can include performing an ozone etch process on the workpiece to at least a portion of the ruthenium layer. The method can also include performing a hydrogen radical treatment process on a workpiece to remove at least a portion of an oxide layer on the copper layer.

19 Claims, 8 Drawing Sheets

(56) References Cited

U.S. PATENT DOCUMENTS

| | | |
|---|---|---|
| 9,903,020 B2 | 2/2018 | Kim et al. |
| 10,847,463 B2 | 11/2020 | Wu et al. |
| 10,872,761 B2 | 12/2020 | Vaniapura et al. |
| 10,944,051 B2 | 3/2021 | Kubo et al. |
| 10,964,528 B2 | 3/2021 | Yang et al. |
| 2002/0070194 A1 | 6/2002 | Nakahara et al. |
| 2006/0054184 A1 | 3/2006 | Mozetic et al. |
| 2012/0006258 A1* | 1/2012 | Schasfoort .......... G03F 7/70925 118/63 |
| 2012/0231561 A1* | 9/2012 | Dolan ............... H01L 21/02071 438/720 |
| 2019/0378692 A1 | 12/2019 | Zhang et al. |
| 2020/0118813 A1 | 4/2020 | Xie et al. |
| 2020/0350161 A1 | 11/2020 | Yang et al. |
| 2021/0082724 A1 | 3/2021 | Xie et al. |
| 2021/0098267 A1 | 4/2021 | Murakami |

OTHER PUBLICATIONS

Gabdrakhmanov, "Improving the efficiency of plasma heat treatment of metals", Journal of Physics: Conference Series, vol. 669, No. 1, Kazan, Russia, Jan. 14, 2016, 4 pages.

\* cited by examiner

PROCESSING OF WORKPIECES USING OZONE GAS AND HYDROGEN RADICALS

PRIORITY CLAIM

The present application is based on and claims priority to U.S. Provisional Application 63/028,786 having a filing date of May 22, 2020, which is incorporated by reference herein.

FIELD

The present disclosure relates generally to semiconductor processing.

BACKGROUND

Chemical mechanical polishing (CMP) can be used for polishing of semiconductor workpieces. In a typical CMP process, a workpiece (e.g., a wafer) is placed in contact with a rotating polishing pad attached to a platen. A CMP slurry, typically an abrasive and chemically reactive mixture, is supplied to the pad during CMP processing of the workpiece. During the CMP process, the pad and/or workpiece are rotated while a polishing head applies pressure against the workpiece. The slurry accomplishing the polishing by chemically and mechanically interacting with the workpiece film being polished due to the effect of the rotational movement of the pad parallel to the workpiece. Polishing is continued in this manner until a desired film on the workpiece is effectively removed.

SUMMARY

Aspects and advantages of embodiments of the present disclosure will be set forth in part in the following description, or may be learned from the description, or may be learned through practice of the embodiments.

Aspects of the present disclosure are directed to a method for processing a workpiece, the workpiece comprising a copper layer and a ruthenium layer, the method comprising: placing a workpiece on a workpiece support in a processing chamber, the workpiece having been processed using a CMP process to at least partially remove the copper layer; performing an ozone etch process on the ruthenium layer to at least partially remove the ruthenium layer, wherein the ozone etch process comprise exposing the workpiece to a process gas containing ozone gas; performing a hydrogen radical treatment process on the workpiece to remove at least a portion of an oxide layer present on the copper layer; and removing the workpiece from the processing chamber.

Aspects of the present disclosure are directed to a method for processing a workpiece, the workpiece comprising a copper layer, a ruthenium layer, and a low-k dielectric material layer, the method comprising: placing a workpiece on a workpiece support in a processing chamber, the workpiece having been processed using a CMP process to at least partially remove the copper layer; exposing the workpiece to a first process gas comprising ozone gas such that the ozone gas at least partially etches the ruthenium layer; admitting a second process gas comprising a hydrogen-containing gas into a plasma chamber; energizing an induction coil to generate a remote plasma containing one more etch species from the second process gas; filtering the one or more etch species generated in the remote plasma using a separation grid to create a filtered mixture, wherein the filtered mixture comprises one or more hydrogen radicals; exposing the workpiece to the filtered mixture in the processing chamber such that the filtered mixture at least partially etches an oxide layer on the copper layer; and removing the workpiece from the processing chamber.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
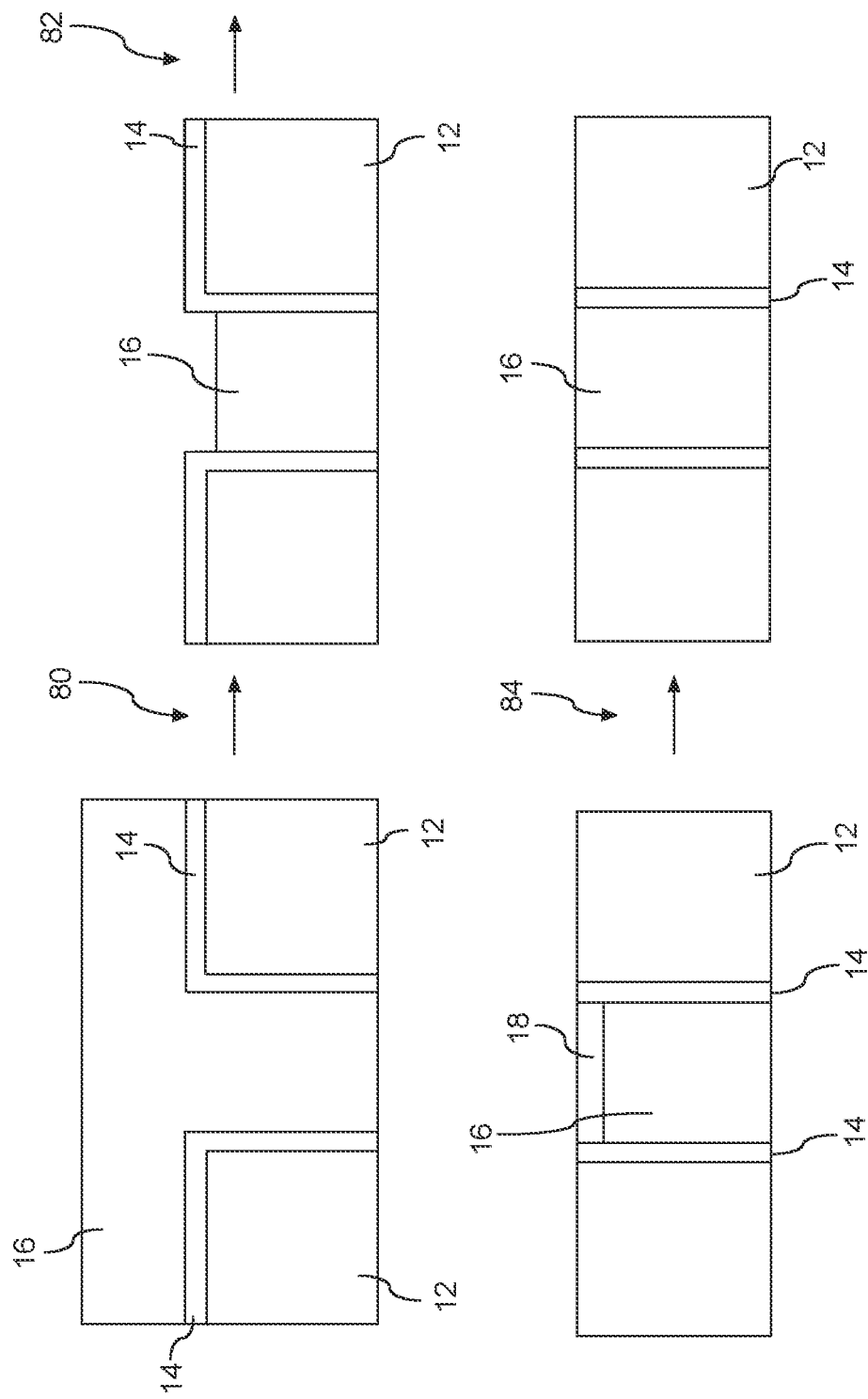
FIG. 1 depicts an example workpiece processing method according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Example aspects of the present disclosure are directed to methods for processing a workpiece to remove metal layers, such as a copper layer and a ruthenium layer, from the surface of a workpiece in preparation for further processing. More specifically, example aspects of the present disclosure are directed to the removal of a ruthenium layer on a workpiece utilizing an ozone etch process. The workpiece can have been previously treated via a CMP process to remove at least a portion of the copper layer from the workpiece prior to removal of the ruthenium layer using the ozone etch process. Additionally, in some embodiments, the workpiece may then be exposed to a hydrogen radical treatment process to remove oxide residues or an oxide layer present on a remaining copper layer on the workpiece.

In a typical CMP process, a workpiece (e.g., a semiconductor wafer) is placed in contact with a rotating polishing pad attached to a platen. A CMP slurry, typically an abrasive and chemically reactive mixture, is supplied to the pad during CMP processing of the workpiece. During the CMP process, the pad and workpiece are rotated while a polishing head applies pressure against the workpiece. The slurry accomplishing the polishing by chemically and mechanically interacting with the workpiece film being polished due to the effect of the rotational movement of the pad parallel to the workpiece. Polishing is continued in this manner until the desired film on the workpiece is effectively removed.

CMP processing is often used to remove and polish excess copper metal at different stages of semiconductor manufacturing. For instance, in a semiconductor manufacturing process used to form a multilevel copper interconnect, metallized copper lines or copper vias are formed by electrochemical metal deposition followed by copper CMP processing. In some processes, an interlevel dielectric (ILD) surface is patterned by a conventional dry etch process to form vias and trenches for vertical and horizontal interconnects and make connection to the sublayer interconnect structures. The patterned ILD surface is coated with an adhesion-promoting layer such as titanium or tantalum and/or a diffusion barrier layer such as ruthenium over the ILD surface and into the etched trenches and vias. The adhesion-promoting layer and/or the diffusion barrier layer is then overcoated with copper, for example, by a seed copper layer and followed by an electrochemically deposited copper layer. Electro-deposition is continued until the structures are filled with the deposited metal. Finally, CMP processing is used to remove the copper overlayer, adhesion-promoting layer, and/or diffusion barrier layer (e.g., ruthenium), until a planarized surface with exposed elevated portions of the dielectric (silicon dioxide and/or low-k dielectric) surface is obtained. The vias and trenches remain filled with electrically conductive copper forming the circuit interconnects.

When CMP processing is used to remove both the copper layer and the barrier layer, such as a ruthenium layer, numerous ruthenium residues may not be effectively removed by the CMP process and, thus, desired removal of the ruthenium layer is not achieved by CMP processing. Additionally, CMP processing can lead to surface oxidation of the copper layers remaining on the workpiece.

CMP processing can also damage other layers on the workpiece, such as low-k dielectric material layers. Porous and non-porous low-k dielectric materials can contain organic components, such as methyl groups in a matrix of silicon dioxide. These materials can have carbon and hydrogen atoms incorporated into a silicon dioxide lattice, which lowers the dielectric constant of the material.

Accordingly, example aspects of the present disclosure provide a workpiece processing method that includes an ozone etch process for effectively removing a ruthenium layer from the workpiece without damaging other low-k dielectric material layers. Upon completion of the ozone etch process, the workpiece can be exposed to a hydrogen radical treatment process for removing any oxide residues from the remaining copper layer and also facilitating annealing of the copper layer.

Aspects of the present disclosure provide a number of technical effects and benefits. For instance, the example processes provided herein allow for a more robust removal of the ruthenium layer without damaging other materials or material layers, such as low-k dielectric material layers, on the workpiece. Further, the methods provided herein allow for etching a ruthenium layer without damaging other low-k dielectric material layers on the workpiece. Additionally, the methods provided allow for the reduction of oxide residues from the copper layer while providing annealing of the copper layer. Further, the ozone etch process and the hydrogen radical surface treatment process provided herein can be performed in situ in the same processing chamber saving processing time and money.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor workpiece or other suitable workpiece. In addition, the use of the term "about" in conjunction with a numerical value is intended to refer to within ten percent (10%) of the stated numerical value. A "pedestal" refers to any structure that can be used to support a workpiece. A "remote plasma" refers to a plasma generated remotely from a workpiece, such as in a plasma chamber separated from a workpiece by a separation grid. A "direct plasma" refers to a plasma that is directly exposed to a workpiece, such as a plasma generated in a processing chamber having a pedestal operable to support the workpiece.

Low dielectric constant (e.g., "low-k") dielectric materials can be used in the fabrication of advanced semiconductor devices. As used herein, a low-k dielectric material can have a dielectric constant of less than about 3.0, such as less than about 2.5, such as less than about 2.2.

FIG. 1 depicts an example processing method on a workpiece 10 according to example embodiments of the present disclosure. The workpiece 10 includes a low-k dielectric material layer 12, a ruthenium layer 14, and a copper layer 16. The low-k dielectric material layer 12 can additionally include oxygen. In some embodiments, the low-k dielectric material layer 12 can be a silicon oxycarbide (SiOC) layer. In some embodiments, the low-k dielectric material layer 12 can be porous. For instance, the low-k dielectric film layer can have a porosity in the range of about 1% to about 50%. As used herein, "porosity" can be a measure the volume of voids or empty spaces in a material relative to the total volume of the material. In some embodiments, (not shown in FIG. 1), the workpiece 10 can further include one or more sublayers (e.g., an oxide layer), and/or a substrate (e.g., a silicon substrate). A CMP process 80 can be conducted to at least partially remove the copper layer 16 from the workpiece 10.

An ozone etch process 82 according to example aspects of the present disclosure can be performed on the workpiece 10 to promote selective removal of at least a portion of the ruthenium layer 14. The surface of the ruthenium layer 14 is exposed to the ozone gas in order to at least partially remove the ruthenium layer 14. The removal of the ruthenium layer 14 can be tuned by controlling one or more parameters, e.g., concentration of the ozone gas, exposure time, temperature of the workpiece 10, process pressure, and any other suitable parameters affecting the removal of the ruthenium layer 14. Additionally, exposure of the workpiece 10 to ozone gas can result in deposition of an oxide layer 18 on the surface of the copper layer 16. The deposition of the oxide layer 18 on the copper layer 16 can be tuned by controlling one or more parameters, e.g., concentration of the ozone gas, exposure time, temperature of the workpiece 10, process pressure, and any other suitable parameters affecting the copper layer 16. In some embodiments, the ozone etch process 82 allows for the removal of the ruthenium layer with reduced damage to a low-k dielectric material layer 12.

A hydrogen radical treatment process 84 according to example aspects of the present disclosure can be performed on the workpiece to promote selective removal of at least a portion of the oxide layer 18 from the copper layer 16. The hydrogen radical treatment process exposes the surface of the workpiece 10 to one or more hydrogen radicals to effectively remove the oxide layer 18 from the workpiece 10. In some embodiments, the hydrogen radicals may be generated from a remote plasma source. The hydrogen radical treatment process 84 can include generating one or more species from a process gas (e.g., a hydrogen containing gas) using a plasma induced in a plasma chamber. The hydrogen radical treatment process 84 can include filtering the one or more species to create a filtered mixture containing one or more hydrogen radicals. The hydrogen radical treatment process 84 can include exposing the workpiece 10 to the filtered mixture containing one or more hydrogen radicals to at least partially remove the oxide layer 18 from the workpiece 10.

Figure 2:
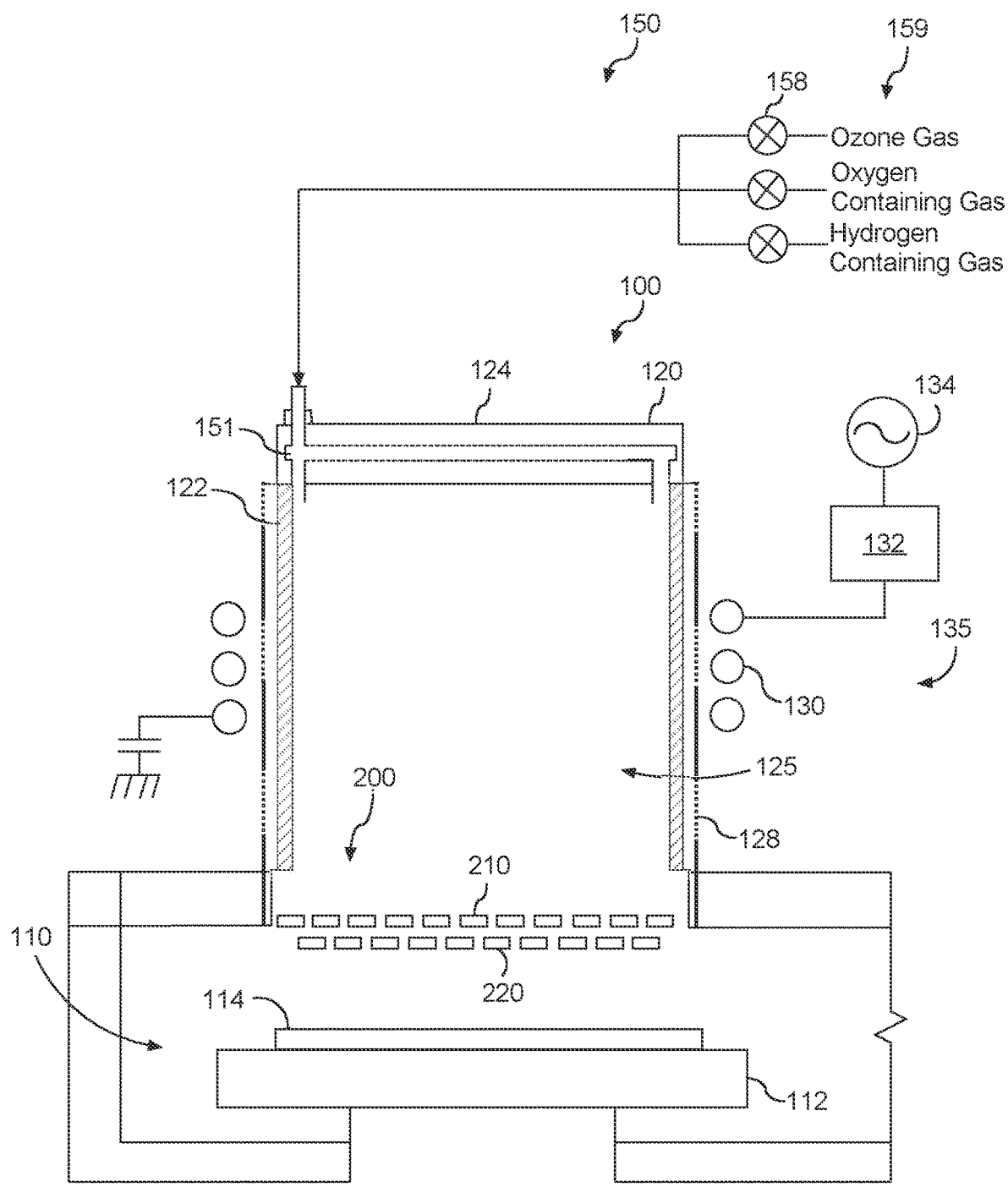
FIG. 2 depicts an example plasma processing apparatus according to example embodiments of the present disclosure.

FIG. 2 depicts an example plasma processing apparatus 100 that can be used to perform processes according to example embodiments of the present disclosure. As illustrated, plasma processing apparatus 100 includes a processing chamber 110 and a plasma chamber 120 that is separated from the processing chamber 110. Processing chamber 110 includes a workpiece support or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

Aspects of the present disclosure are discussed with reference to an inductively coupled plasma source for purposes of illustration and discussion. Those of ordinary skill in the art, using the disclosures provided herein, will understand that any plasma source (e.g., inductively coupled plasma source, capacitively coupled plasma source, etc.) can be used without deviating from the scope of the present disclosure.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases, for example a fluorine-containing gas or a hydrogen-containing gas, can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 2, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber 110.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded. In some embodiments, the grid assembly can include a single grid with one grid plate.

As shown in FIG. 2, according to example aspects of the present disclosure, the apparatus 100 can include a gas delivery system 150 configured to deliver process gas to the plasma chamber 120, for instance, via gas distribution channel 151 or other distribution system (e.g., showerhead). The gas delivery system can include a plurality of feed gas lines 159. The feed gas lines 159 can be controlled using valves 158 and/or mass flow controllers to deliver a desired amount of gases into the plasma chamber as process gas. As shown in FIG. 2, the gas delivery system 150 can include feed gas line(s) for delivery of an oxygen containing gas (e.g. $O_2$ or $O_3$), and feed gas line(s) for delivery of a hydrogen containing gas (e.g., $H_2$, or $NH_3$) In some embodiments, oxygen containing gas and/or the hydrogen containing gas can be mixed with an inert gas that can be called a "carrier" gas, such as He, Ar, Ne, Xe, or $N_2$. A control valve 158 can be used to control a flow rate of each feed gas line to flow a process gas into the plasma chamber 120. The plasma processing apparatus 150 of FIG. 2 can implement the ozone etch process and the hydrogen radical treatment process using remote plasma.

Figure 3:
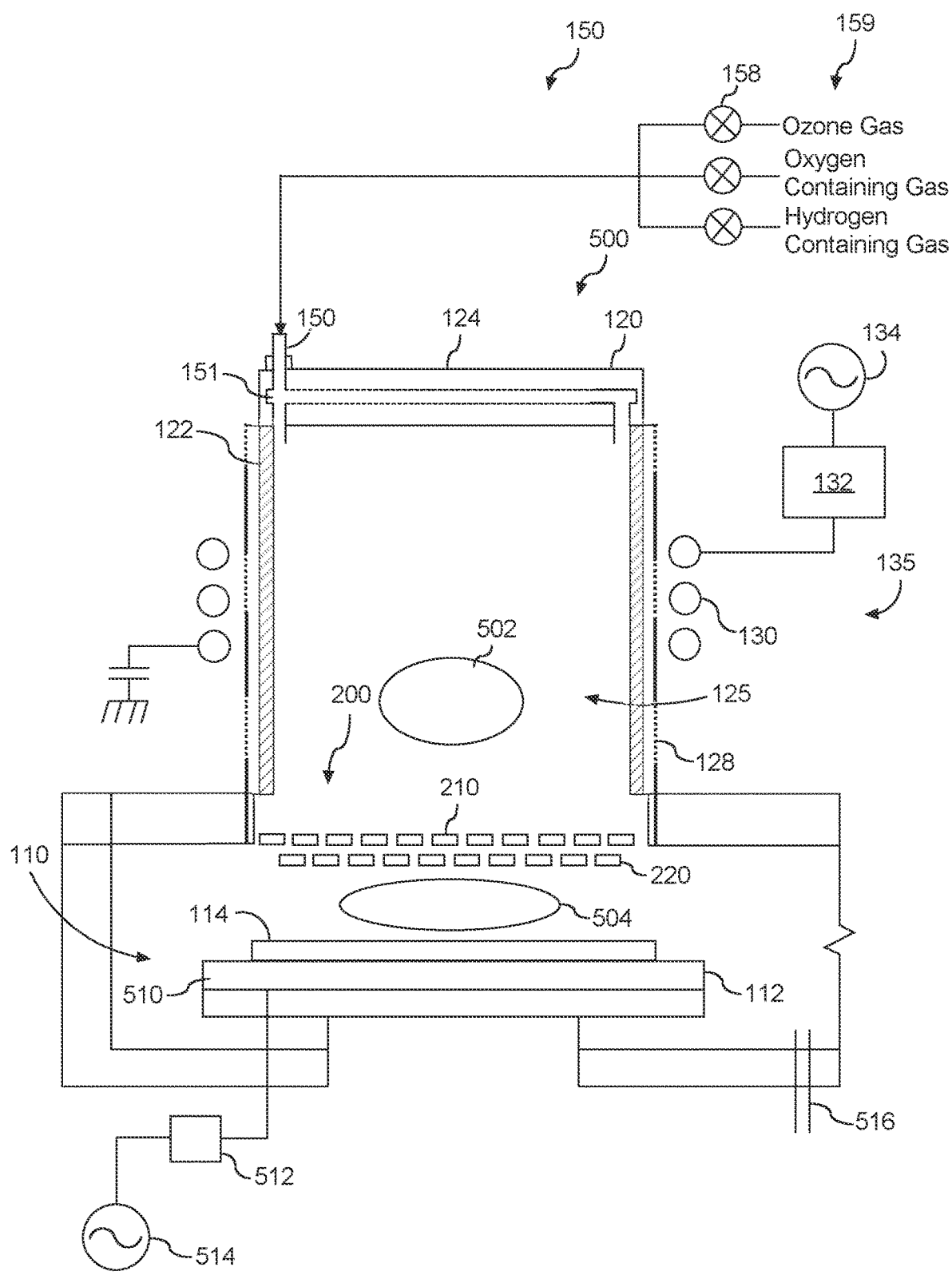
FIG. 3 depicts an example plasma processing apparatus according to example embodiments of the present disclosure.

FIG. 3 depicts an example plasma processing apparatus 500 that can be used to implement processes according to example embodiments of the present disclosure. The plasma processing apparatus 500 is similar to the plasma processing apparatus 100 of FIG. 2.

More particularly, plasma processing apparatus 500 includes a processing chamber 110 and a plasma chamber 120 that is separated from the processing chamber 110. Processing chamber 110 includes a workpiece holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gases (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 3, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 500 of FIG. 3 is operable to generate a first plasma 502 (e.g., a remote plasma) in the plasma chamber 120 and a second plasma 504 (e.g., a direct plasma) in the processing chamber 110.

More particularly, the plasma processing apparatus 500 of FIG. 3 includes a bias source having a bias electrode 510 in the pedestal 112. The bias electrode 510 can be coupled to an RF power generator 514 via a suitable matching network 512. When the bias electrode 510 is energized with RF energy, a second plasma 504 can be generated from a mixture in the processing chamber 110 for direct exposure to the workpiece 114. The processing chamber 110 can include a gas exhaust port 516 for evacuating a gas from the processing chamber 110. The radicals or species used in the breakthrough process or etch process according to example aspects of the present disclosure can be generated using the first plasma 502 and/or the second plasma 504.

Figure 4:
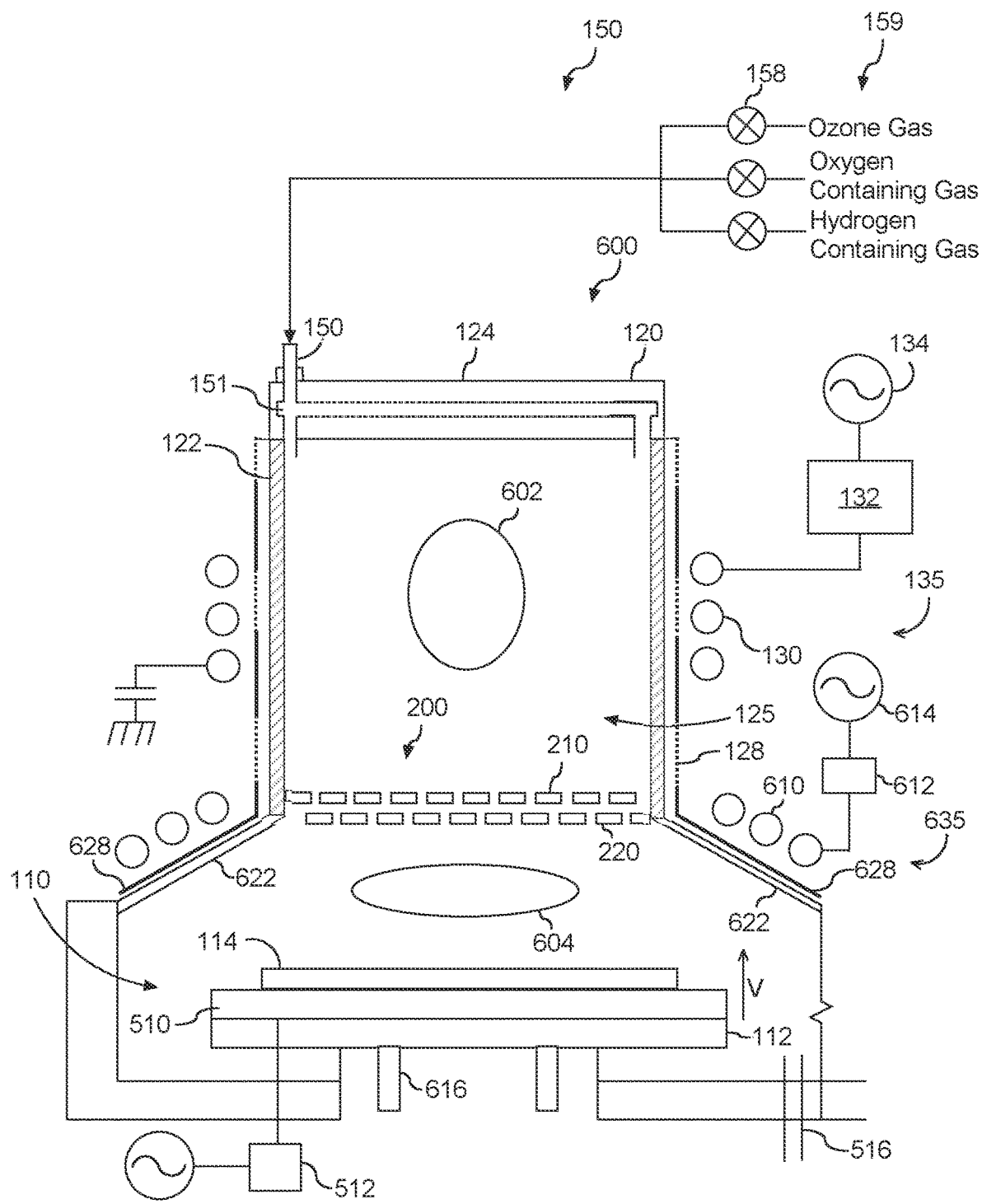
FIG. 4 depicts an example plasma processing apparatus according to example embodiments of the present disclosure.

FIG. 4 depicts a processing chamber 600 similar to that of FIG. 2 and FIG. 3. More particularly, plasma processing apparatus 600 includes a processing chamber 110 and a plasma chamber 120 that is separated from the processing chamber 110. Processing chamber 110 includes a workpiece holder or pedestal 112 operable to hold a workpiece 114 to be processed, such as a semiconductor wafer. In this example illustration, a plasma is generated in plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The inductively coupled plasma source 135 can include an induction coil 130 disposed adjacent the dielectric side wall 122 about the plasma chamber 120. The induction coil 130 is coupled to an RF power generator 134 through a suitable matching network 132. Process gas (e.g., an inert gas) can be provided to the chamber interior from gas supply 150 and annular gas distribution channel 151 or other suitable gas introduction mechanism. When the induction coil 130 is energized with RF power from the RF power generator 134, a plasma can be generated in the plasma chamber 120. In a particular embodiment, the plasma processing apparatus 100 can include an optional grounded Faraday shield 128 to reduce capacitive coupling of the induction coil 130 to the plasma.

As shown in FIG. 4, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber.

In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

The example plasma processing apparatus 600 of FIG. 4 is operable to generate a first plasma 602 (e.g., a remote plasma) in the plasma chamber 120 and a second plasma 604 (e.g., a direct plasma) in the processing chamber 110. As shown, the plasma processing apparatus 600 can include an angled dielectric sidewall 622 that extends from the vertical sidewall 122 associated with the remote plasma chamber 120. The angled dielectric sidewall 622 can form a part of the processing chamber 110.

A second inductive plasma source 635 can be located proximate the dielectric sidewall 622. The second inductive plasma source 635 can include an induction coil 610 coupled to an RF generator 614 via a suitable matching network 612. The induction coil 610, when energized with RF energy, can induce a direct plasma 604 from a mixture in the processing chamber 110. A Faraday shield 628 can be disposed between the induction coil 610 and the sidewall 622.

The pedestal 112 can be movable in a vertical direction V. For instance, the pedestal 112 can include a vertical lift 616 that can be configured to adjust a distance between the pedestal 112 and the separation grid assembly 200. As one example, the pedestal 112 can be located in a first vertical position for processing using the remote plasma 602. The pedestal 112 can be in a second vertical position for processing using the direct plasma 604. The first vertical position can be closer to the separation grid assembly 200 relative to the second vertical position.

Figure 5:
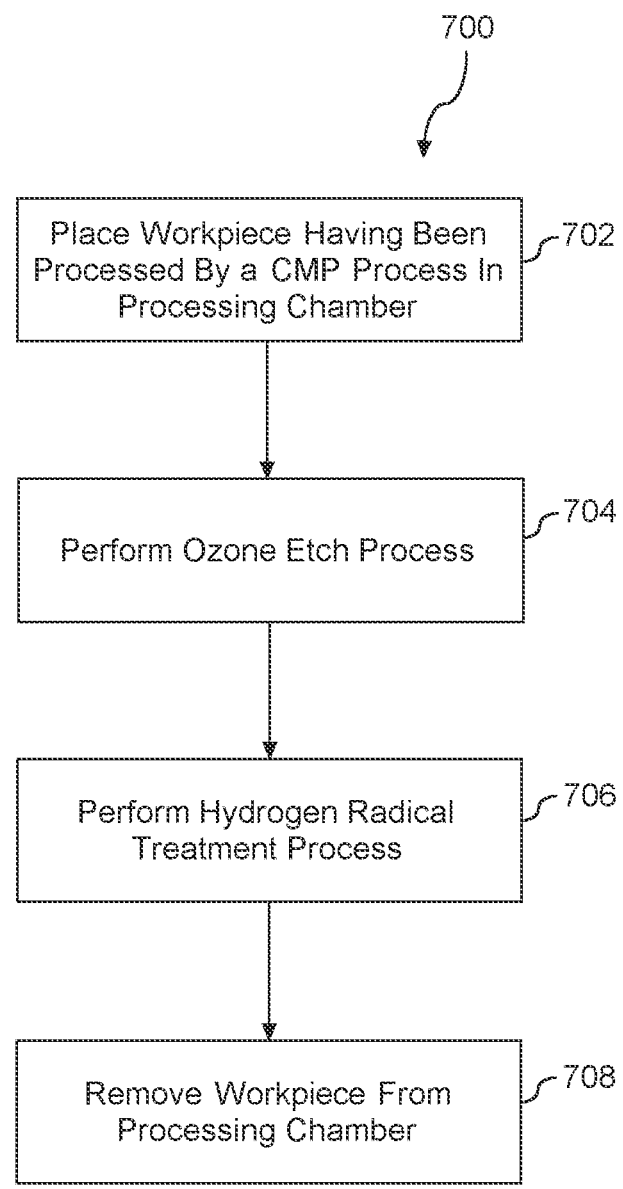
FIG. 5 depicts an example flow diagram of an example workpiece processing method according to example embodiments of the present disclosure.

The plasma processing apparatus 600 of FIG. 5 includes a bias source having bias electrode 510 in the pedestal 112. The bias electrode 510 can be coupled to an RF power generator 514 via a suitable matching network 512. The processing chamber 110 can include a gas exhaust port 516 for evacuating a gas from the processing chamber 110. The hydrogen radicals used in the photoresist etch processes according to example aspects of the present disclosure can be generated using the first plasma 602 and/or the second plasma 604.

FIG. 5 depicts a flow diagram of one example method (700) according to example aspects of the present disclosure. The method (700) will be discussed with reference to the plasma processing apparatus 100 of FIG. 2 by way of example. The method (700) can be implemented in any suitable plasma processing apparatus. FIG. 5 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (702), the method can include placing a workpiece 114 in a processing chamber 110 of a plasma processing apparatus 100. The processing chamber 110 can be separated from a plasma chamber 120 (e.g., separated by a separation grid assembly). For instance, the method can include placing a workpiece 114 onto workpiece support 112 in the processing chamber 110. The workpiece 114 has been processed using a CMP process to at least partially remove the copper layer from the workpiece.

At (704) the method can include performing an ozone etch process to at least partially remove a ruthenium layer on the workpiece 114. The ozone etch process can be conducted to promote selective etching of the ruthenium layer with respect to other layers, such as the copper layer or low-k dielectric material layer on the workpiece. Ozone gas can be delivered to the plasma chamber 120. For instance, ozone gas can be delivered to the plasma chamber 120 by a feed gas line(s) and can pass through the separation grid 200 to reach the workpiece 114. In some embodiments, ozone gas can be delivered into the processing chamber 110 via the separation grid 200 or below the separation grid 200 so that the ozone gas is injected downstream of the plasma source. The workpiece 114 can include a ruthenium layer, a copper layer, and/or a low-k dielectric material layer. The ozone gas can react with a surface of the workpiece to remove at least a portion of the ruthenium layer on the workpiece. The ozone gas can also react with the copper layer of the workpiece and deposit oxide residues or an oxide layer on the copper layer on the workpiece. In certain embodiments, the ozone gas is capable of removing ruthenium from the workpiece without causing damage to other low-k dielectric material layers present on the workpiece. In some embodiments, removal of the ruthenium layer can be controlled by adjusting one or more parameters, e.g., concentration of the ozone gas, workpiece temperature, process pressure, process time and/or any other suitable parameter affecting the removal of the ruthenium layer. In certain embodiments, the thickness and quality of the oxide layer on the copper layer can be controlled by adjusting one or more parameters, e.g., concentration of the ozone gas, workpiece temperature, process pressure, process time and/or any other suitable parameter affecting the oxide layer. In some embodiments, the ozone etch process is conducted at a process temperature of from about 20° C. to about 300° C. In some embodiments, the ozone etch process is conducted at a process pressure of from about 100 mT to about 100 T.

In some embodiments, the ozone gas can be admitted through one or more gas injections ports in the separation grid. In other embodiments, where the processing chamber and plasma chamber are separated by a separation grid, the ozone gas can be admitted into the plasma chamber and can flow through the separation grid to the processing chamber. For instance, a process gas can be admitted into the plasma chamber interior 125 from a gas source 150 via annular gas distribution channel 151 or other suitable gas introduction mechanism. In some embodiments, the process gas can include ozone gas and oxygen gas. For example, in certain embodiments the process gas can include from about 1% to about 50% by volume of ozone gas. Still, in certain embodiments, the ozone process gas can be admitted through one or more injection ports in the processing chamber.

At (706), the method (700) can include performing a hydrogen radical treatment process to at least partially remove oxide residues or an oxide layer from the copper layer on the workpiece 114. The hydrogen radical treatment process can include admitting a process gas into the plasma chamber 120. For instance, a process gas can be admitted into the plasma chamber interior 125 from a gas source 150 via annular gas distribution channel 151 or other suitable gas introduction mechanism. In some embodiments, the process gas can include a hydrogen containing gas. In some embodiments, the process gas can include a hydrogen containing gas such as hydrogen ($H_2$), ammonia ($NH_3$), and combinations thereof. In some embodiments, the process gas can include oxygen ($O_2$).

The process gas is energized via an inductively coupled plasma source to generate a plasma in a plasma chamber 120. For instance, induction coil 130 can be energized with RF energy from RF power generator 134 to generate a plasma in the plasma chamber interior 125. In some embodiments, the inductively coupled plasma source can be energized with pulsed power to obtain desired radicals with reduced plasma energy. The plasma can be used to generate one or more radicals from the process gas.

The hydrogen radical treatment process (706) can include filtering one or more ions generated by the plasma to create a filtered mixture. The filtered mixture can include neutral hydrogen radicals. In some embodiments, the one or more ions can be filtered using a separation grid assembly 200 separating the plasma chamber 120 from a processing chamber 110 where the workpiece is located. In some embodiments, the hydrogen radical treatment process (706) can include filtering one or more species generated in the remote plasma using a separation grid to create a filtered mixture containing one or more hydrogen radicals.

For instance, separation grid assembly 200 can be used to filter ions generated by the plasma. The separation grid 200 can have a plurality of holes. Charged particles (e.g., ions) can recombine on the walls in their path through the plurality of holes. Neutral species (e.g. radicals) can pass through the holes.

In some embodiments, the separation grid 200 can be configured to filter ions with an efficiency greater than or equal to about 90%, such as greater than or equal to about 95%. A percentage efficiency for ion filtering refers to the amount of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid 200 can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

The hydrogen radical treatment process (706) can include exposing the workpiece to the filtered mixture. The filtered mixture can contain hydrogen radicals. Exposing the workpiece to the filtered mixture can result in removal of at least a portion of oxide residues or an oxide layer present on the copper layer on the workpiece 114. Furthermore, exposing the workpiece to the filtered mixture can facilitate annealing of the copper layer on the workpiece 114. The hydrogen radical treatment process can be conducted at a process temperature of from about 20° C. to about 500° C. The hydrogen radical treatment process is conducted at a process pressure of from about 10 mT to about 10 T.

In some embodiments, one or more hydrogen radicals can be generated using a tungsten filament. In certain other embodiments, one or more hydrogen radicals may be generated by mixing a hydrogen containing gas with one or more excited inert gas molecules downstream of a plasma source.

At (708) the method can include removing the workpiece from the processing chamber. For instance, the workpiece 114 can be removed from workpiece support 112 in the processing chamber 110. The plasma processing apparatus can then be conditioned for future processing of additional workpieces.

Figure 6:
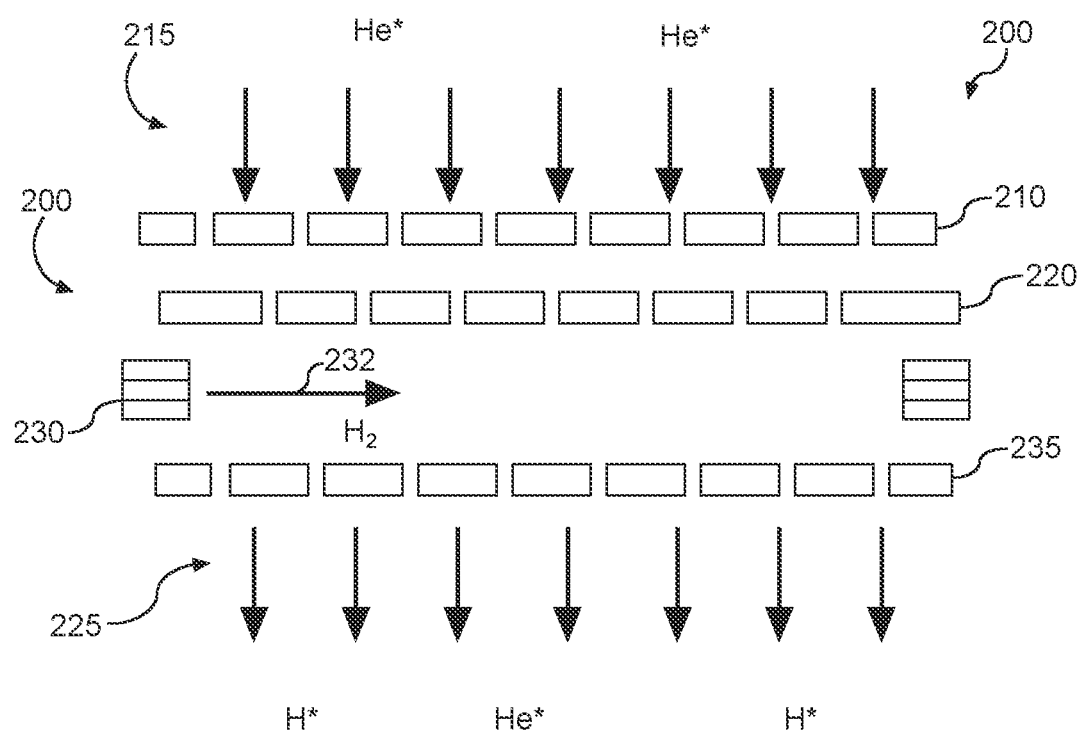
FIG. 6 depicts example generation of hydrogen radicals using post-plasma gas injection according to example embodiments of the present disclosure.

FIG. 6 depicts example generation of hydrogen radicals using post-plasma gas injection according to example embodiments of the present disclosure. More particularly, FIG. 6 depicts an example separation grid 200 for injection of hydrogen post-plasma according to example embodiments of the present disclosure. More particularly, the separation grid 200 includes a first grid plate 210 and a second grid plate 220 disposed in parallel relationship. The first grid plate 210 and the second grid plate 220 can provide for ion/UV filtering.

The first grid plate 210 and a second grid plate 220 can be in parallel relationship with one another. The first grid plate 210 can have a first grid pattern having a plurality of holes. The second grid plate 220 can have a second grid pattern having a plurality of holes. The first grid pattern can be the same as or different from the second grid pattern. Species (e.g., excited inert gas molecules, such as exited helium gas molecules) 215 from the plasma can be exposed to the separation grid 200. Charged particles (e.g., ions) can recombine on the walls in their path through the holes of each grid plate 210, 220 in the separation grid 200. Neutral species can flow relatively freely through the holes in the first grid plate 210 and the second grid plate 220.

Subsequent to the second grid plate 220, a gas injection source 230 can be configured to mix hydrogen 232 into the species passing through the separation grid 200. A mixture 225 including hydrogen radicals resulting from the injection of hydrogen gas can pass through a third grid plate 235 for exposure to the workpiece in the processing chamber.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the hydrogen can be mixed with the species at any point in the separation grid and/or after the separation grid in the processing chamber. For instance, the gas injection source 230 can be located between first grid plate 210 and second grid plate 220.

Figure 7:
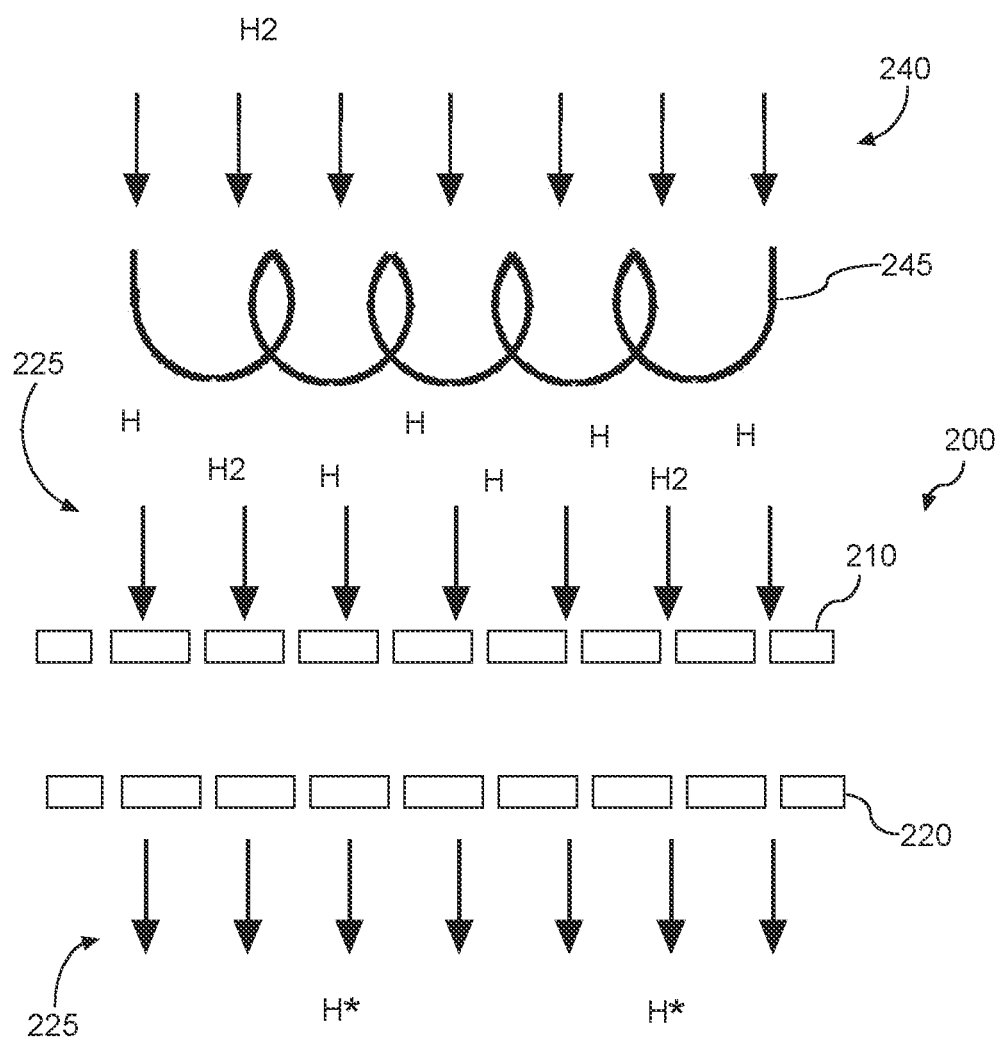
FIG. 7 depicts example generation of hydrogen radicals using a filament according to example embodiments of the present disclosure.

In some embodiments, the hydrogen radicals can be generated by passing a hydrogen gas over a heated filament (e.g., a tungsten filament). For example, as shown in FIG. 7, a hydrogen gas $H_2$ 240 can be passed over a heated filament 245 (e.g., a tungsten filament) to generate a mixture 225 containing hydrogen radicals in a first chamber. The hydrogen radicals 225 can be passed through a separation grid 200.

The separation grid 200 includes a first grid plate 210 and a second grid plate 220 disposed in parallel relationship. The first grid plate 210 can have a first grid pattern having a plurality of holes. The second grid plate 220 can have a second grid pattern having a plurality of holes. The first grid pattern can be the same as or different from the second grid pattern.

The hydrogen radical treatment process can be implemented using other plasma processing apparatus without deviating from the scope of the present disclosure.

Figure 8:
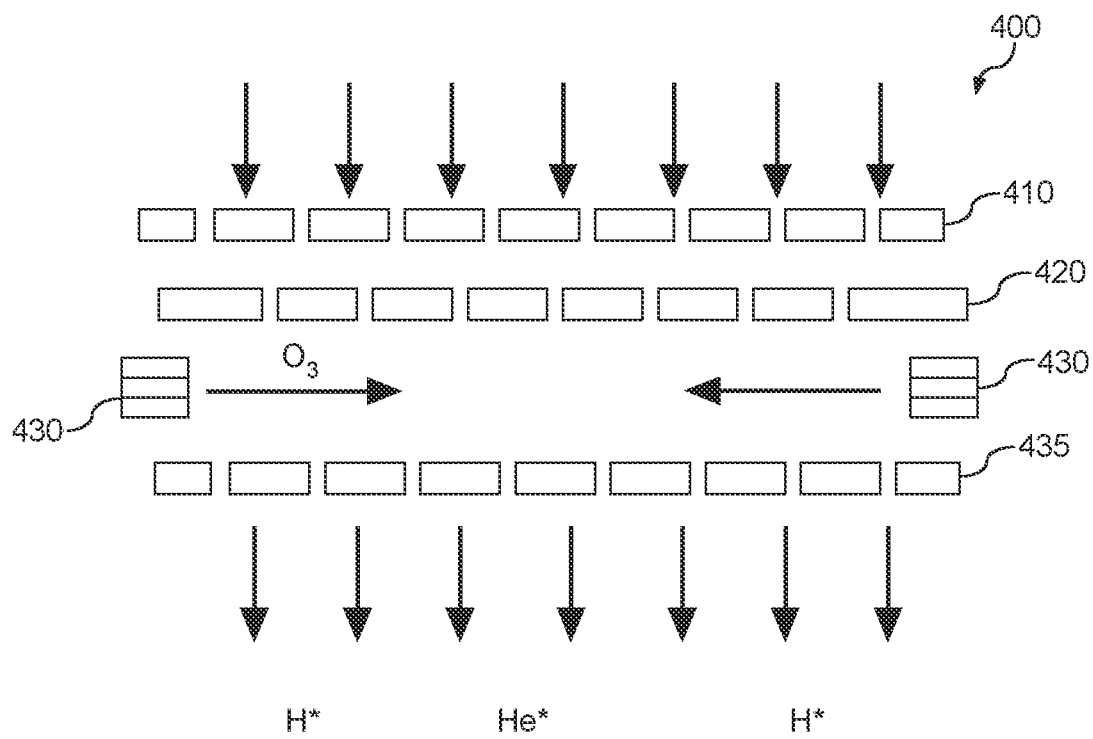
FIG. 8 depicts example injection of an ozone containing gas using post-plasma injection according to example embodiments of the present disclosure.

FIG. 8 depicts example injection of ozone gas at a separation grid according to example embodiments of the present disclosure. The separation grid 400 includes a first grid plate 410 and a second grid plate 420 disposed in parallel relationship. The first grid plate 410 and the second grid plate 420 can provide for ion/UV filtering. The separation grid 400 can be one embodiment of the separation grid 200.

The first grid plate 410 can have a first grid pattern having a plurality of holes. The second grid plate 420 can have a second grid pattern having a plurality of holes. The first grid pattern can be the same as or different from the second grid pattern. Species from the plasma can be exposed to the separation grid 400. Charged particles (e.g., ions) can recombine on the walls in their path through the holes of each grid plate 410, 420 in the separation grid 400. Neutral species can flow relatively freely through the holes in the first grid plate 410 and the second grid plate 420.

Subsequent to the second grid plate 420, a gas injection source 430 can be configured to introduce ozone gas into the species passing through the separation grid 400. A mixture can pass through a third grid plate 435 for exposure to the workpiece in the processing chamber.

The present example is discussed with reference to a separation grid with three grid plates for example purposes. Those of ordinary skill in the art, using the disclosures provided herein, will understand that more or fewer grid plates can be used without deviating from the scope of the present disclosure. In addition, the ozone gas can be mixed with the species at any point in the separation grid and/or after the separation grid in the processing chamber. For instance, the gas source 430 can be located between first grid plate 410 and second grid plate 420.

Example process parameters for the etch process will now be set forth.

Example 1

Process Gas: $O_3$, concentration 13%
Dilution Gas: $O_2$
Process Pressure: 2000 mT
Inductively Coupled Plasma Source Power: No Power
Workpiece Temperature: 125° C.
Process Period (time): 5 min
Gas Flow Rates for Process Gas:
Gas 1+Dilution Gas=1000 sccm. Gas 1 ($O_3$)~13%

Example process parameters for the hydrogen radical treatment process will now be set forth.

Example 2

Process Gas: $H_2$, $O_2$
Dilution Gas: none
Process Pressure: 200 mT
Source Power: 3500 W
Bias Power: none
Workpiece Temperature: 300° C.
Process Period (time): 5 min
Gas Flow Rates for Process Gas:
Gas 1: 1900 sccm $H_2$
Gas 2: 100 sccm $O_2$ While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method for processing a workpiece, the workpiece comprising a copper layer and a ruthenium layer, the method comprising:
    placing a workpiece on a workpiece support in a processing chamber, the workpiece having been processed using a CMP process to at least partially remove the copper layer;
    performing an ozone etch process on the ruthenium layer to at least partially remove the ruthenium layer, wherein the ozone etch process comprise exposing the workpiece to a process gas containing ozone gas;
    performing a hydrogen radical treatment process on the workpiece to remove at least a portion of an oxide layer present on the copper layer, wherein the hydrogen radical treatment process comprises generating one or more hydrogen radicals by mixing a hydrogen-containing gas with one or more excited inert gas molecules downstream of a plasma source; and
    removing the workpiece from the processing chamber.

2. The method of claim 1, wherein the ozone etch process comprises:
    admitting the process gas containing ozone gas into the processing chamber; and
    exposing the workpiece to the ozone gas such that the at least a portion of the ruthenium layer is removed.

3. The method of claim 2, wherein the process gas comprises ozone gas and an oxygen gas.

4. The method of claim 3, wherein the process gas comprises from about 1% to about 50% by volume of ozone gas.

5. The method of claim 2, wherein the processing chamber and a plasma chamber are separated by a separation grid, further wherein the ozone process gas is admitted through one or more gas injection ports in the separation grid.

6. The method of claim 2, wherein the processing chamber and a plasma chamber are separated by a separation grid, further wherein admitting an ozone process gas into the processing chamber comprises admitting the ozone process gas into the plasma chamber and allowing the ozone process gas to flow through the separation grid to the processing chamber.

7. The method of claim 2, wherein ozone process gas is admitted through one or more gas injection ports in the processing chamber.

8. The method of claim 1, wherein the ozone etch process is conducted at a process temperature of from about 20° C. to about 300° C.

9. The method of claim 1, wherein the ozone etch process is conducted at a process pressure of from about 100 mT to about 100 T.

10. The method of claim 1, wherein the hydrogen radical treatment process comprises:
    admitting a process gas into a plasma chamber;
    energizing an induction coil to generate a remote plasma from the process gas;
    filtering one or more species generated in the remote plasma using a separation grid to create a filtered mixture containing one or more hydrogen radicals, the separation grid separating the plasma chamber from the processing chamber; and exposing the workpiece to the filtered mixture in the processing chamber such that the filtered mixture at least partially etches oxide residues or an oxide layer from the copper layer.

11. The method of claim 1, wherein the hydrogen-containing gas includes hydrogen ($H_2$), ammonia ($NH_3$), or combinations thereof.

12. The method of claim 1, wherein performing a hydrogen radical treatment process on the workpiece comprises generating one or more hydrogen radicals using a tungsten filament.

13. The method of claim 1, wherein the process gas includes an oxygen-containing gas.

14. The method of claim 1, wherein the hydrogen radical treatment process is conducted at a process temperature of from about 20° C. to about 500° C.

15. The method of claim 1, wherein the hydrogen radical treatment process is conducted at a process pressure of from about 10 mT to about 10 T.

16. A method for processing a workpiece, the workpiece comprising a copper layer, a thenium layer, and a low-k dielectric material layer, the method comprising:

placing a workpiece on a workpiece support in a processing chamber, the workpiece having been processed using a CMP process to at least partially remove the copper layer;

exposing the workpiece to a first process gas comprising ozone gas such that the ozone gas at least partially etches the ruthenium layer;

admitting a second process gas comprising a hydrogen-containing; gas into a plasma chamber;

energizing an induction coil to generate a remote plasma containing one more etch species from the second process gas;

filtering the one or more etch species generated in the remote plasma using a separation grid to create a filtered mixture;

mixing a hydrogen-containing gas with the filtered mixture downstream of the plasma chamber to form a filtered mixture containing hydrogen radicals;

exposing the workpiece to the filtered mixture in the processing chamber such that the filtered mixture at least partially etches an oxide layer on the copper layer; and removing the workpiece from the processing chamber.

17. The method of claim 16, wherein the ozone gas is admitted through one or more gas injection ports in the processing chamber.

18. The method of claim 16, wherein the ozone gas is admitted through one or more gas injection ports in a separation grid.

19. The method of claim 16, wherein the ozone gas is admitted into the plasma chamber and flows through a separation grid to the processing chamber.

* * * * *